(12) United States Patent  (10) Patent No.: US 7,956,375 B2
Li et al.  (45) Date of Patent: Jun. 7, 2011

(54) LIGHT EMITTING DIODE STRUCTURE HAVING A TEXTURED PACKAGE LENS

(75) Inventors: Yueh-Han Li, Hsin-Chu (TW); Po-Tang Hsu, Hsin-Chu (TW); Chien-Ming Ko, Hsin-Chu (TW); Hung-Ching Lee, Hsin-Chu (TW); Chih-Wei Lin, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 0 days.

(21) Appl. No.: 12/485,237

(22) Filed: Jun. 16, 2009

(65) Prior Publication Data

US 2010/0044732 A1  Feb. 25, 2010

(30) Foreign Application Priority Data

Aug. 20, 2008 (TW) .............................. 97131841 A (51) Int. Cl.
H01L 29/22 (2006.01)
H01L 29/227 (2006.01)
H01L 33/00 (2006.01)
H01L 31/0203 (2006.01)

(52) U.S. Cl. .............. 257/98; 257/95; 257/99; 257/434; 257/E33.065; 257/E33.068; 257/E33.073; 257/E33.074

(58) Field of Classification Search .......... 257/95, 257/98, E33.065, E33.068, E33.073, E33.074, 257/99, 434
See application file for complete search history.

(56) References Cited

U.S. PATENT DOCUMENTS

| 6,831,786 | B2 * | 12/2004 | Bourdelais et al. | 359/599 |
|---|---|---|---|---|
| 7,207,706 | B2 * | 4/2007 | Leu et al. | 362/612 |
| 7,282,748 | B2 * | 10/2007 | Takeda et al. | 257/98 |
| 7,315,048 | B2 * | 1/2008 | Fung et al. | 257/95 |
| 7,339,200 | B2 * | 3/2008 | Amano et al. | 257/98 |
| 7,352,011 | B2 * | 4/2008 | Smits et al. | 257/99 |
| 7,436,000 | B2 * | 10/2008 | Kim et al. | 257/98 |
| 7,482,633 | B2 * | 1/2009 | Chiaretti | 257/89 |
| 7,503,676 | B2 * | 3/2009 | Sakumoto | 362/293 |
| 7,679,095 | B2 * | 3/2010 | Kondo | 257/98 |
| 7,682,853 | B2 * | 3/2010 | Ashida | 438/28 |

(Continued)

FOREIGN PATENT DOCUMENTS

CN 1527408 9/2004

(Continued)

OTHER PUBLICATIONS

Chinese language office action dated Nov. 6, 2009.

(Continued)

*Primary Examiner* — Ida M Soward
(74) *Attorney, Agent, or Firm* — Thomas, Kayden, Horstemeyer & Risley, LLP (57) ABSTRACT

A light emitting diode structure and a light emitting diode structure forming method are provided. The light emitting diode structure includes a base, a diode chip, and a package lens. The diode chip is mounted on the base. The package lens covers the diode chip. The surface of the package lens includes a plurality of dot structures. The steps of the method include mounting a light-emitting diode chip on a base, assembling a package lens to cover the light emitting diodes chip, and forming a plurality of dot structures on the surface of the package lens.

19 Claims, 8 Drawing Sheets

U.S. PATENT DOCUMENTS

| | | | |
|---|---|---|---|
| 7,733,567 B2* | 6/2010 | Li et al. ........................ | 359/619 |
| 2003/0169504 A1* | 9/2003 | Kaminsky et al. ............ | 359/622 |
| 2004/0026706 A1* | 2/2004 | Bogner et al. ................. | 257/99 |
| 2004/0084681 A1* | 5/2004 | Roberts .......................... | 257/79 |
| 2004/0189185 A1* | 9/2004 | Yotsuya ......................... | 313/501 |
| 2006/0001965 A1* | 1/2006 | Ebina et al. ................... | 359/457 |
| 2006/0027828 A1* | 2/2006 | Kikuchi ......................... | 257/99 |
| 2006/0050379 A1* | 3/2006 | Yee et al. ...................... | 359/454 |
| 2006/0054904 A1* | 3/2006 | Lin et al. ....................... | 257/88 |
| 2006/0267037 A1* | 11/2006 | Lim et al. ...................... | 257/98 |
| 2006/0285332 A1* | 12/2006 | Goon et al. .................... | 362/327 |
| 2007/0051960 A1* | 3/2007 | Yu .................................. | 257/88 |
| 2007/0212802 A1* | 9/2007 | Lee et al. ....................... | 438/22 |
| 2007/0257610 A1* | 11/2007 | Shen .............................. | 313/512 |
| 2008/0064131 A1* | 3/2008 | Chang ............................ | 438/29 |
| 2008/0084693 A1* | 4/2008 | Shimada et al. ............... | 362/240 |
| 2008/0121918 A1* | 5/2008 | DenBaars et al. ............. | 257/98 |
| 2008/0128730 A1* | 6/2008 | Fellows et al. ................ | 257/98 |
| 2008/0142822 A1* | 6/2008 | Kim et al. ...................... | 257/98 |
| 2008/0308825 A1* | 12/2008 | Chakraborty et al. ......... | 257/98 |
| 2009/0014737 A1* | 1/2009 | Tsai et al. ...................... | 257/98 |
| 2009/0321759 A1* | 12/2009 | Xu .................................. | 257/98 |

FOREIGN PATENT DOCUMENTS

| | | |
|---|---|---|
| JP | 2006-048165 | 2/2006 |

OTHER PUBLICATIONS

English language translation of abstract of CN 1527408 (published Sep. 8, 2004).

Chinese language office action dated Jun. 5, 2009.

English language translation of abstract and pertinent parts of JP 2006-048165.

* cited by examiner

LIGHT EMITTING DIODE STRUCTURE HAVING A TEXTURED PACKAGE LENS

BACKGROUND OF THE INVENTION

1. Field of the Invention

This invention generally relates to a light emitting diode structure. More particularly, this invention relates to a light emitting diode structure for providing a more uniform light and a method of forming the same.

2. Description of the Prior Art

Light emitting diodes are small in volume and low consumption in energy. Therefore, light emitting diodes are widely used as the light sources of many electronic devices, including liquid crystal display.

Figure 1:
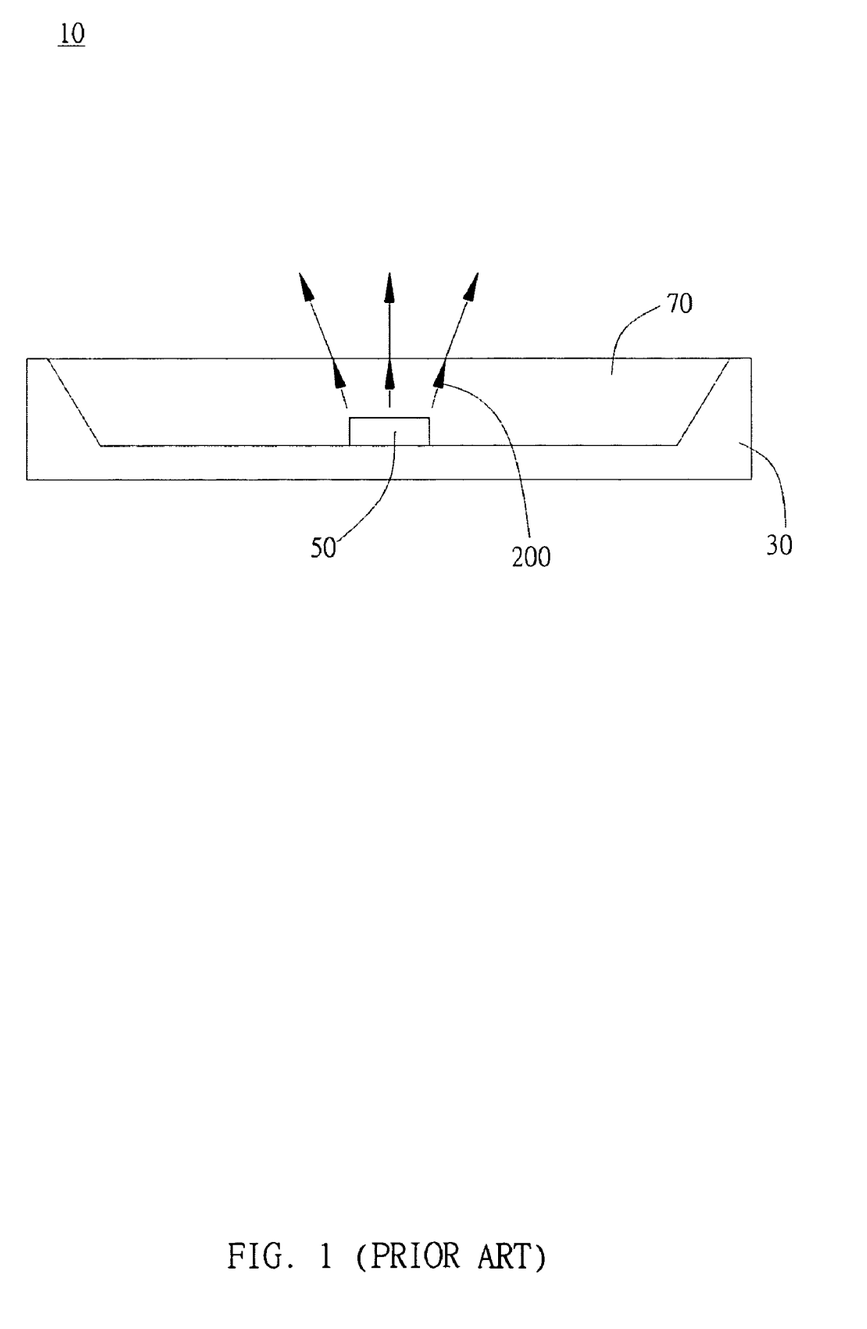
FIG. 1 is a schematic view of a conventional light emitting diode structure.

As shown in FIG. 1, a conventional light emitting diode structure 10 includes a base 30, a diode chip 50, and a package lens 70. The diode chip 50 is mounted on the base 30. The package lens 70 covers the diode chip 50.

As shown in FIG. 1, the light 200 emitted from the diode chip 50 has no significant change after passing the package lens 70. More particularly, since the surface of the package lens 70 is far larger than the diode chip 50 and the emitting angle of the light 200 emitted from the diode chip 500 is limited, the light 200 emitted from the diode chip 500 is non-uniformly distributed on the surface of the package lens 70. Therefore, the conventional light emitting diode structure 10 is still improvable.

SUMMARY OF THE INVENTION

It is an object of the present invention to provide a light emitting diode structure having a larger light emitting angle.

It is another object of the present invention to provide a light emitting diode structure having a more uniform light.

It is another object of the present invention to provide a light emitting diode structure forming method for increasing the light emitting angle.

It is another object of the present invention to provide a light emitting diode structure forming method for enhancing the uniformity of the light distribution.

The light emitting diode structure of the present invention includes a base, a diode chip, and a package lens. The diode chip is mounted on the base. The package lens covers the diode chip. The surface of the package lens includes a plurality of dot structures.

The surface of the package lens is curved or flat. The plurality of dot structures and the package lens are integrally formed into a single piece. In other embodiments, the plurality of dot structures are attached to the surface of the package lens. The plurality of dot structures are selected from a group consisting of a circle, a rectangle, a regular polygon, and a polygon. The plurality of dot structures are embossed structures. The embossed structures are selected from a group consisting of a hemisphere, a cone, a pyramid, and a prism. The distribution density of the plurality of dot structures is uniform. In other embodiments, the distribution density of the plurality of dot structures can be gradually increased or decreased with respect to the central location of the diode chip The steps of the method include mounting a light emitting diode chip on a base, assembling a package lens to cover the light emitting diode chip, and forming a plurality of dot structures on the surface of the package lens.

The plurality of dot structures forming step includes forming the dot structures on the surface of the package lens by coating, spraying, or screen printing. The step of forming the plurality of dot structures on the surface of the package lens can further include uniformly distributing the dot structures on the surface of the package lens or increasing the distribution density of the plurality of dot structures on the surface of the package lens corresponding to the central location of the diode chip.

DETAILED DESCRIPTION OF THE PREFERRED EMBODIMENT

The present invention provides a light emitting diode structure and a light emitting diode structure forming method. In a preferred embodiment shown in FIG. 2, the light emitting diode structure 100 includes a base 300, a diode chip 500, and a package lens 700. The diode chip 500 is mounted on the base 300. The package lens 700 covers the diode chip 500, wherein the surface of the package lens 700 includes a plurality of dot structures 710. In this embodiment, the package lens 700 has a flat surface. In other embodiments shown in FIG. 3, however, the package lens 700 has a curved surface.

Figure 2:
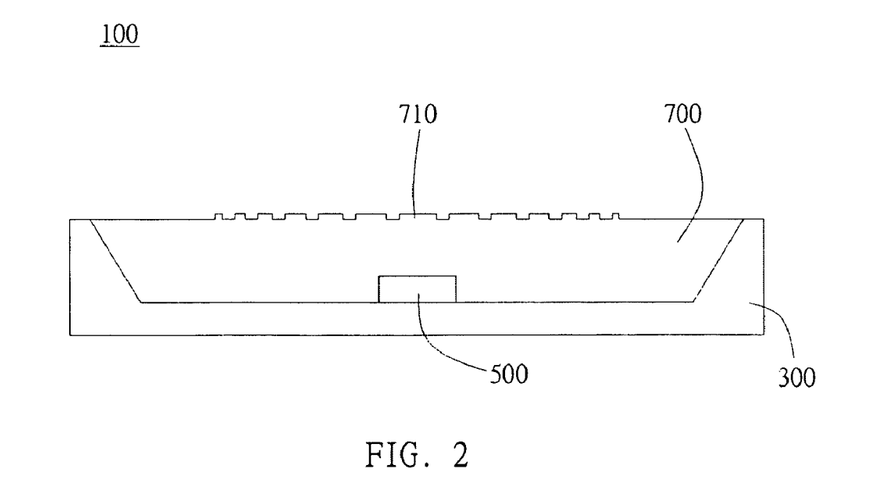
FIG. 2 is a schematic view of a preferred embodiment of the present invention.
Figure 3:
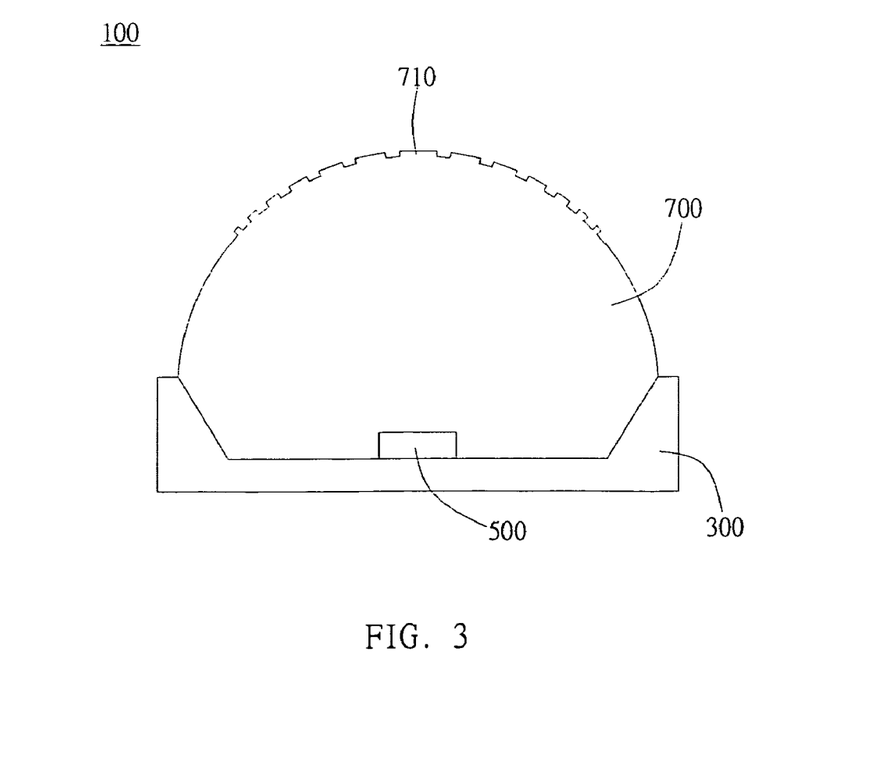
FIG. 3 is a schematic view of one embodiment of the present invention having a curved surface package lens.
Figure 4:
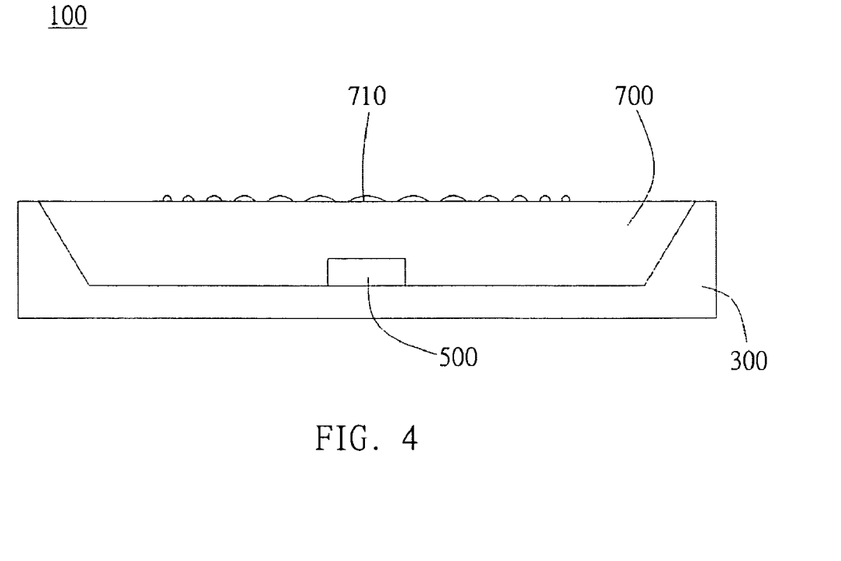
FIG. 4 is a schematic view showing the plurality of dot structures are attached on the surface of the package lens.

In the preferred embodiment shown in FIG. 2, the plurality of dot structures 710 and the package lens 700 are integrally formed into a single piece. In another embodiment, as shown in FIG. 4, however, the plurality of dot structures 710 are attached to the surface of the package lens 700 by coating, spraying, or screen printing. The plurality of dot structures 710 are selected from a group consisting of a circle, a rectangle, a regular polygon, and a polygon, wherein the top face of the plurality of dot structures 710 are preferably convex. In other embodiments, however, the top face of the plurality of dot structures 710 may be flat, concave, or rugged.

Figure 5:
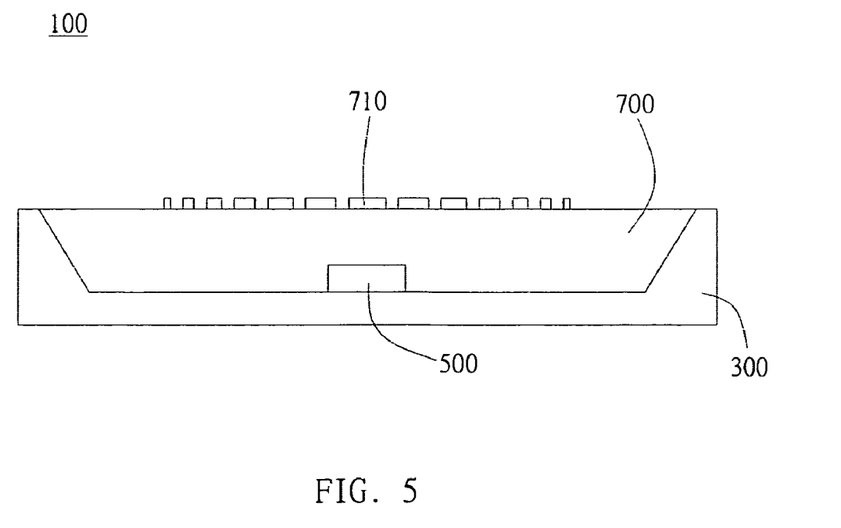
FIG. 5 is a schematic view showing the plurality of dot structures are embossed structures.

In another embodiment, as shown in FIG. 5, the plurality of dot structures 710 are embossed structures. Different from the embodiment shown in FIG. 4, the plurality of dot structures 710 are pillars protruding from the surface of the package lens 700. Therefore, the light reflection and light interference between the plurality of dot structures 710 are more significant. The embossed structures, i.e. the plurality of dot structures 710, are selected from a group consisting of a hemisphere, a cone, a pyramid, and a prism.

Figure 6A:
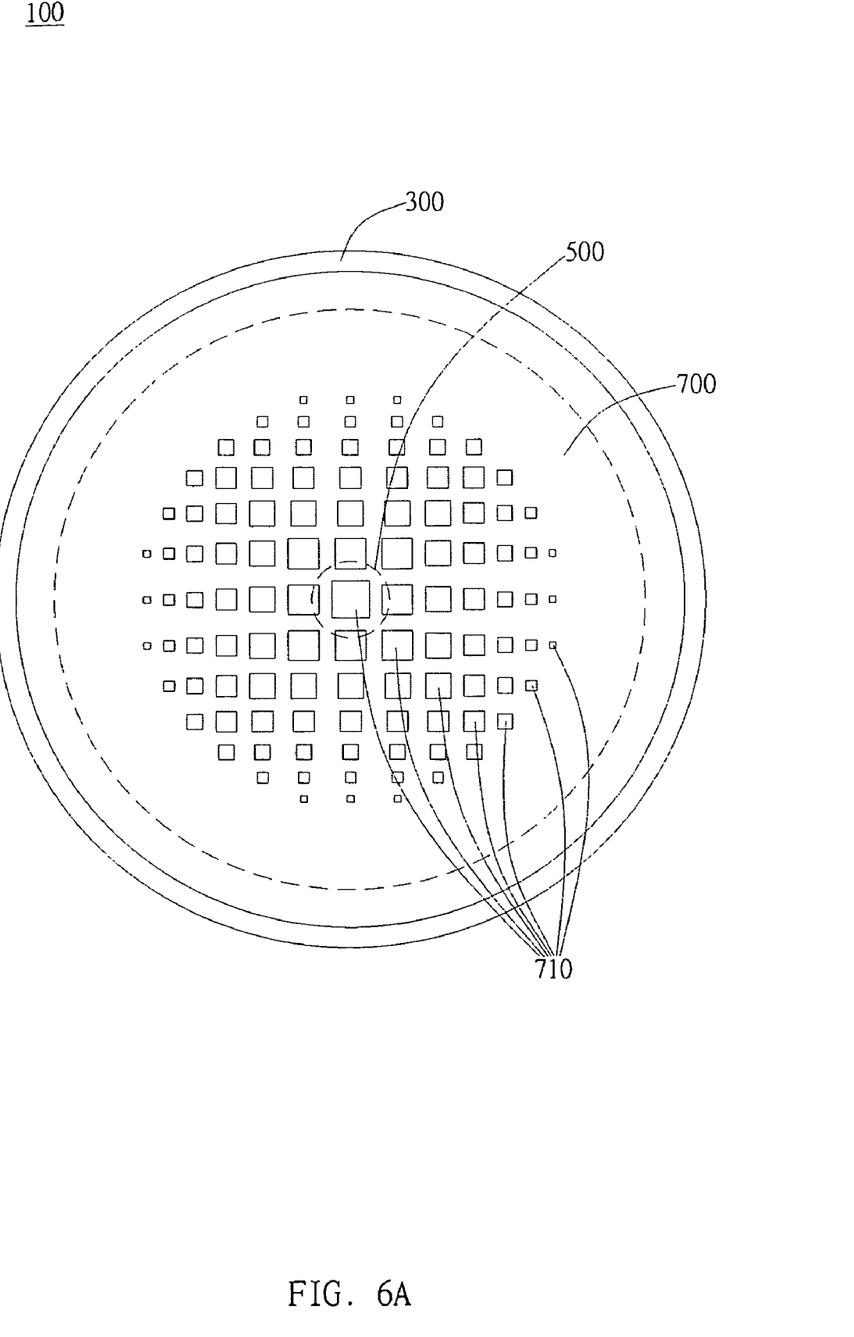
FIG. 6A is a top view of a preferred embodiment of the present invention.
Figure 6B:
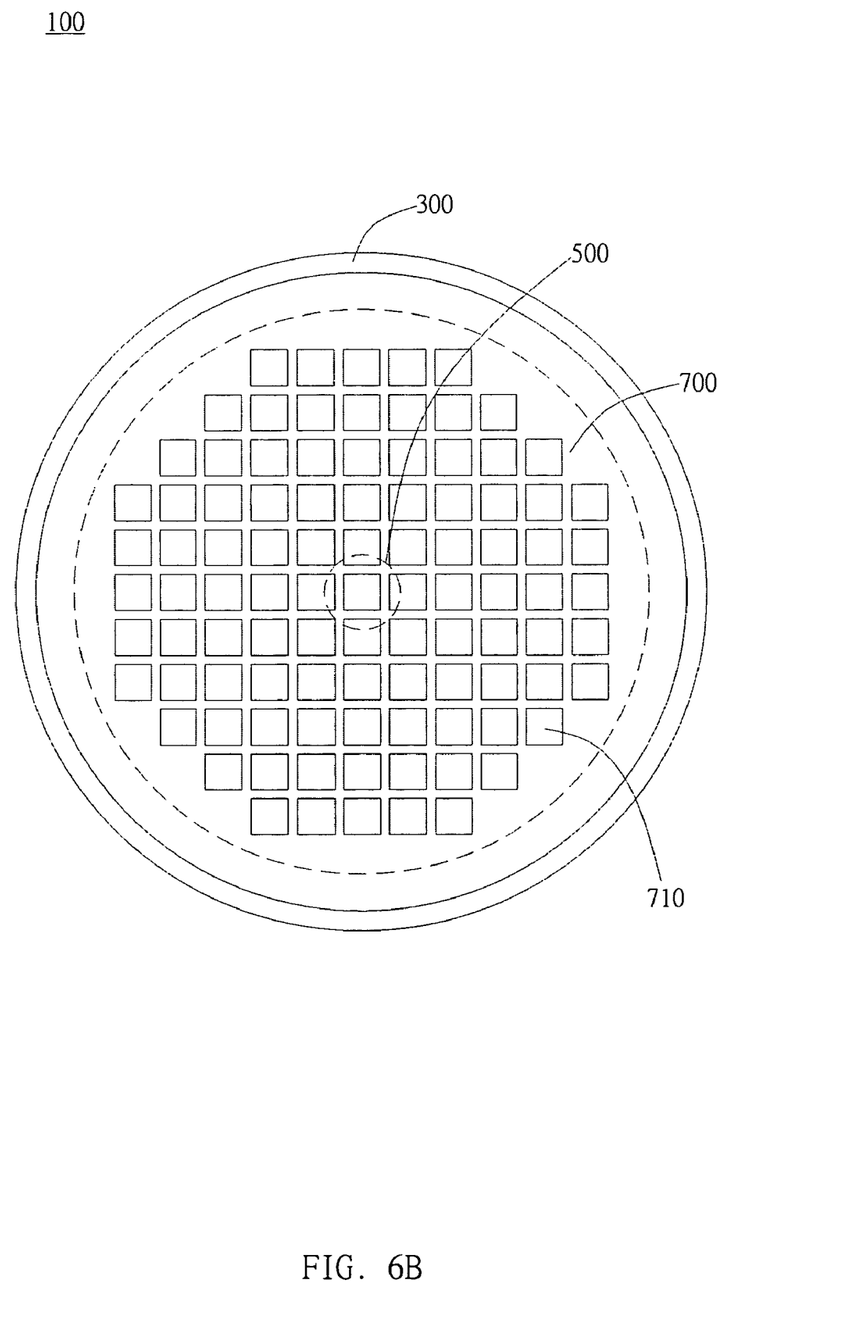
FIG. 6B is a top view of another embodiment of the present invention.

The area of the plurality of dot structures 710 on the surface of the package lens 700 can be modified in accordance with design requirements. As shown in FIG. 6A, which is a top view of the preferred embodiment shown in FIG. 2, the dot structures 710 located near the region corresponding to the central location of the diode chip 500 have a larger area. However, in other embodiments, the plurality of dot structures 710 may have a same area as shown in FIG. 6B, or have a different area in a different region. For example, the area of the plurality of dot structures 710 may be gradually increased or decreased with respect to the central location of the diode chip 500 or the dot structures 710 may be divided into several groups by block. In this way, the dot structures 710 in different blocks may have different areas. By adjusting the area of the dot structures 710 at different locations, the emitting angle and the uniformity of the light emitted from the diode chip 500 can be modified.

Figure 6C:
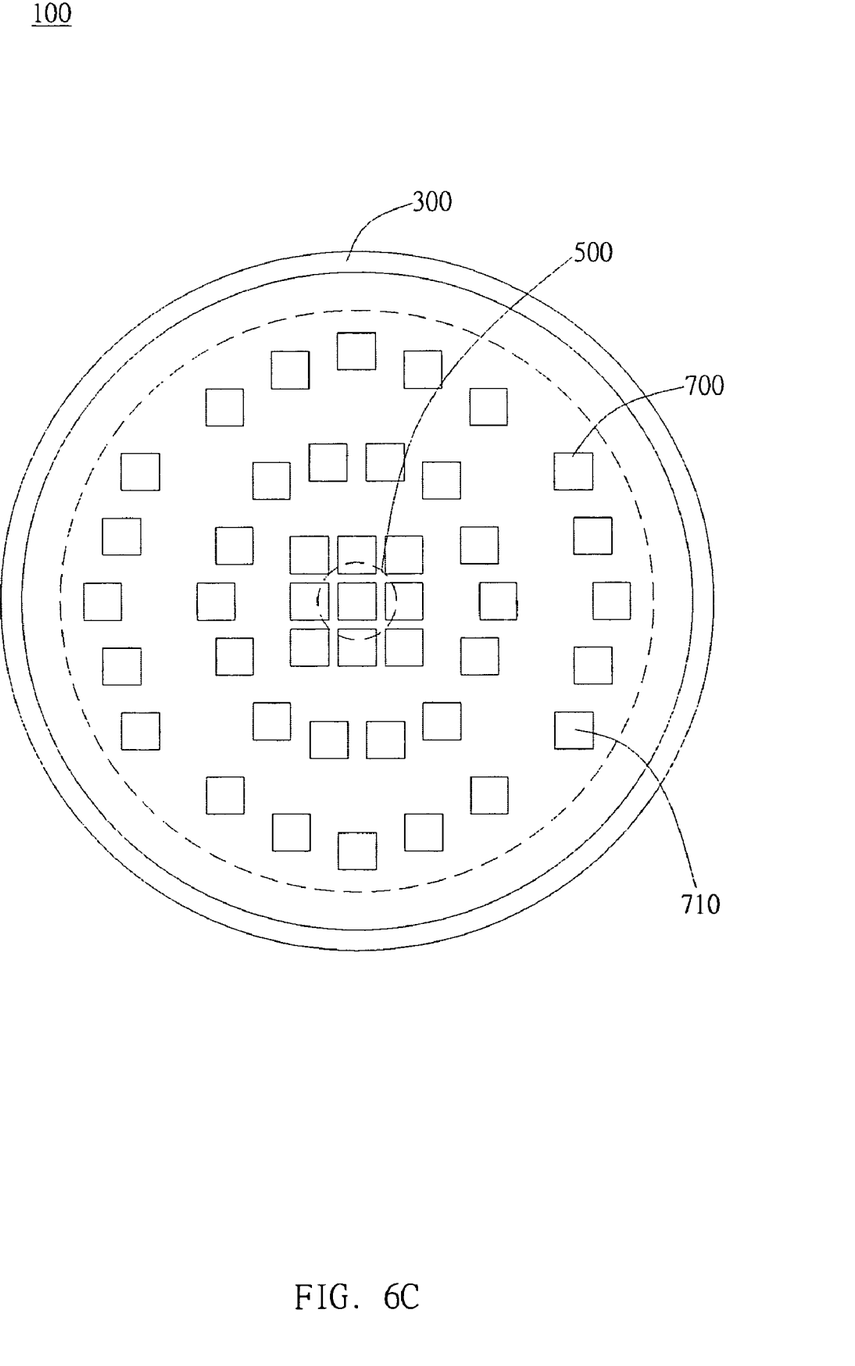
FIG. 6C is a top view of another embodiment of the present invention.

The distribution density of the plurality of dot structures 710 on the surface of the package lens 700 can be modified in accordance with design requirements. In other words, the manner how the plurality of dot structures 710 disposed on the surface of the package lens 700 can be changed in accordance with distribution density requirements. As shown in FIG. 6B, the distribution density of the dot structures 710 is uniform. Therefore, the dot structures 710 are uniformly distributed on the surface of the package lens 700. However, in another embodiment shown in FIG. 6C, the distribution density of the plurality of dot structures 710 is increased toward the central location of the diode chip 500. In other words, the distribution of the dot structures 710 on the surface of the package lens which corresponds to the central location of the diode chip 500 is more dense. In another embodiment, the distribution density of the plurality of dot structures 710 is decreased toward the central location of the diode chip 500. In still another embodiment, the plurality of dot structures 710 are divided into several groups by block, wherein the dot structures 710 in different blocks have different distribution densities. By adjusting the distribution density of the dot structures 710 at different locations, the emitting angle and the uniformity of the light emitted from the diode chip 500 can be modified.

Figure 7:
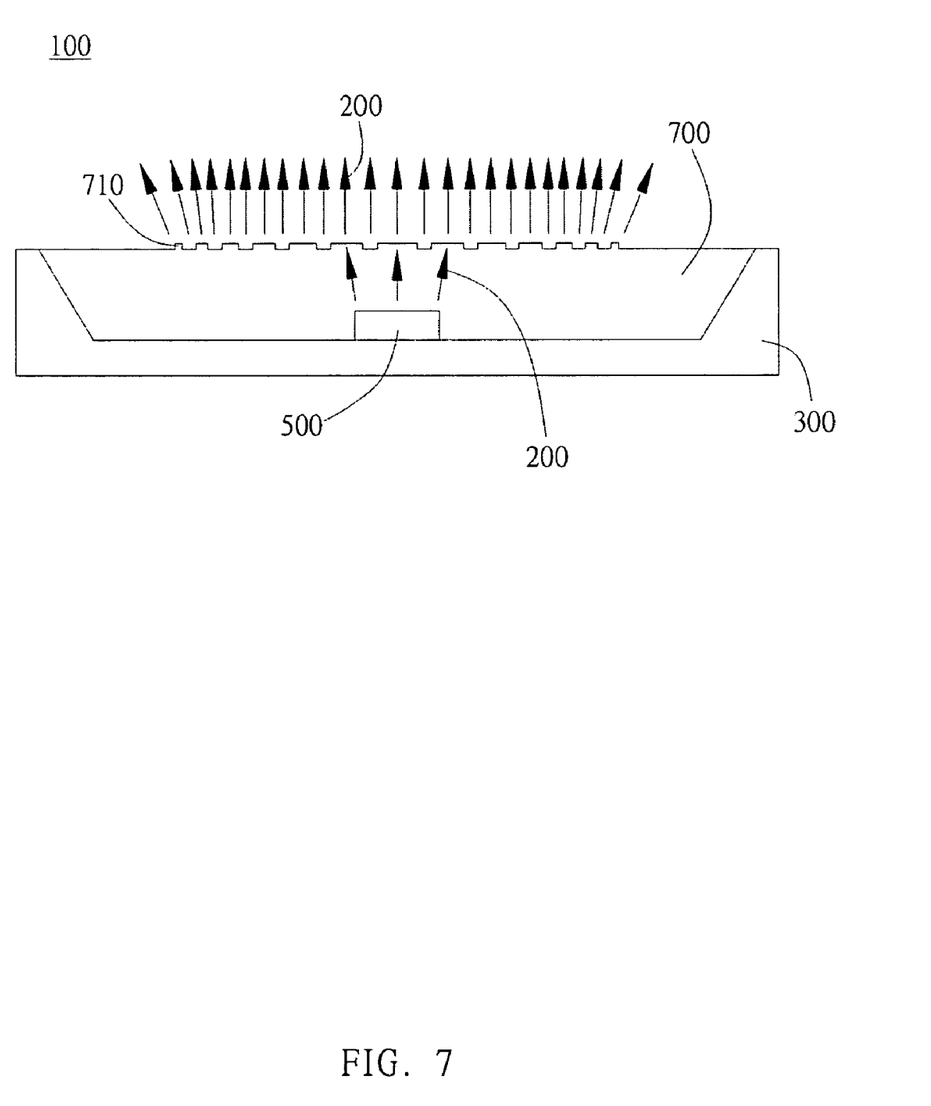
FIG. 7 is a schematic view showing the emission of the light of the preferred embodiment of the present invention.

A schematic light emission diagram of the light emitting diode structure 100 of the present invention is shown in FIG. 7. By disposing the dot structures 710 on the surface of the package lens 700, the emitting angle and the uniformity of the light emitted from the diode chip 500 can be modified. More particularly, the light 200 emitted from the diode chip 500 changes the emitting angle after passing through and being refracted by the dot structures 710 of the surface of the package lens 700. Therefore, the light emitted from the light emitting diode structure 100 of the present invention is more uniform. On the other hand, the emitting angle of the light emitted from the diode chip 500 can be further modified by modifying the configuration, the area, or the distribution density of the dot structures 710.

Figure 8:
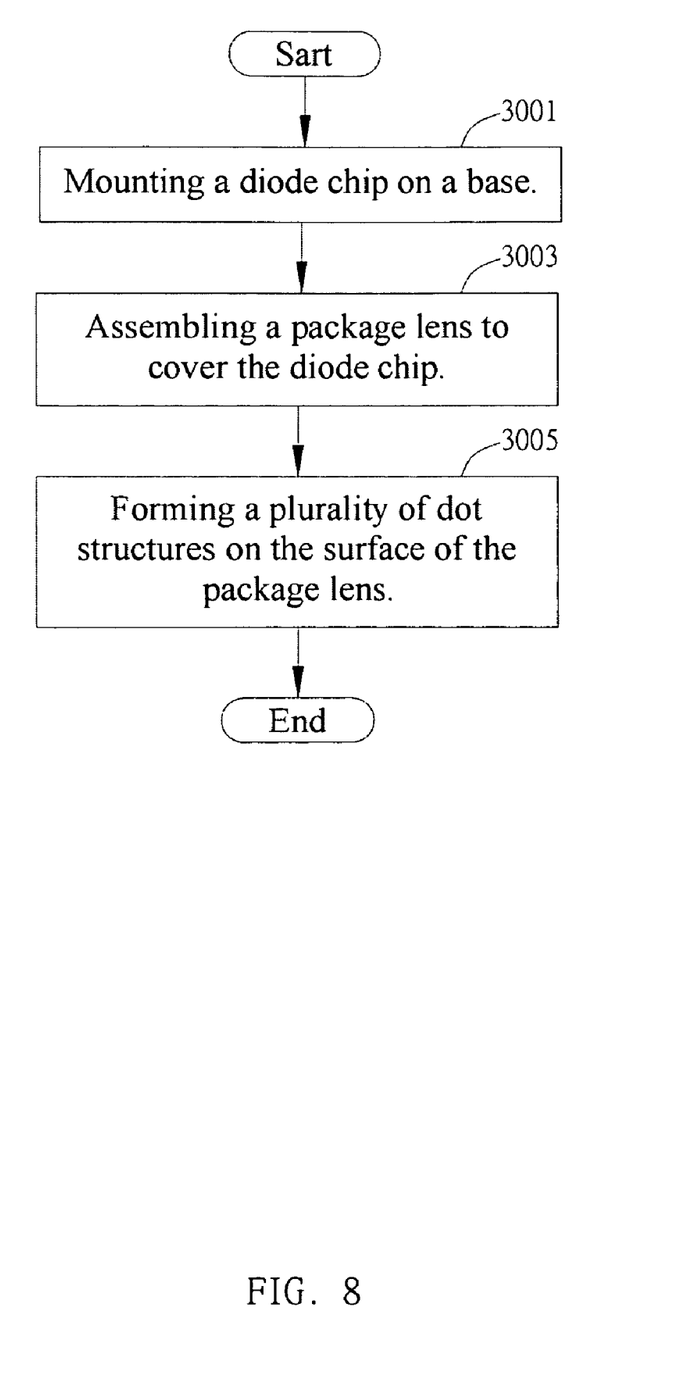
FIG. 8 is a flow chart of the preferred embodiment of the present invention.

A flow chart of the light emitting diode structure forming method of the present invention is shown in FIG. 8, wherein the light emitting diode structure forming method includes the following steps.

Step 3001, a step of mounting a diode chip on a base is performed. The diode chip may include different color types of light emitting diode chips, such as a blue type, a yellow type, a red type, etc.

Step 3003, a step of assembling a package lens to cover the diode chip is performed. The surface of the package lens can be curved or flat. Materials, such as a fluorescent material, can be added into the package lens to change the optical characteristics of the light according to different design needs.

Step 3005, a step of forming a plurality of dot structures on the surface of the package lens is performed. The plurality of dot structures can be attached to the surface of the package lens by coating, spraying, or screen printing, wherein the plurality of dot structures are selected from a group consisting of a circle, a rectangle, a regular polygon, and a polygon. On the other hand, the dot structures are embossed structures, wherein the embossed structures are selected from a group consisting of a hemisphere, a cone, a pyramid, and a prism.

The step of forming the dot structures on the surface of the package lens can further include designing the area and the distribution location of the dot structures in accordance with the distribution density of the dot structures. For example, the area of the dot structures may be gradually increased or decreased with respect to the central location of the diode chip or the dot structures may be divided into several groups by block. In this way, the dot structures 710 in different blocks have different areas. Moreover, the step of forming the dot structures on the surface of the package lens can further include uniformly distributing the dot structures on the surface of the package lens or increasing or decreasing the distribution density of the plurality of dot structures on the surface of the package lens with respect to the central location of the diode chip to meet the scattering or the uniformity requirements. For example, the distribution density of the dot structures is decreased or increased with respect to the central location of the diode chip. Alternatively, the dot structures 710 are divided into several groups by block, wherein the dot structures in different blocks have different distribution densities.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A light emitting diode structure, comprising:
a base;
a diode chip mounted on the base; and
a package lens covering the diode chip, wherein the surface of the package lens includes a plurality of dot structures, wherein the plurality of dot structures are disposed within a structure region from the outer most dot structure to the inner most dot structure, wherein the dot structures cover a first area of the structure region and expose a second area of the structure region, wherein a ratio of the first area to the second area is increased toward the central location of the diode chip.

2. The light emitting diode structure of claim 1, wherein the surface of the package lens is curved or flat.

3. The light emitting diode structure of claim 1, wherein the plurality of dot structures and the package lens are integrally formed into a single piece.

4. The light emitting diode structure of claim 1, wherein the plurality of dot structures are attached on the surface of the package lens.

5. The light emitting diode structure of claim 1, wherein the plurality of dot structures are selected from a group consisting of a circle, a rectangle, a regular polygon, and a polygon.

6. The light emitting diode structure of claim 1, wherein the plurality of dot structures are embossed structures.

7. The light emitting diode structure of claim 6, wherein the embossed structures are selected from a group consisting of a hemisphere, a cone, a pyramid, and a prism.

8. The light emitting diode structure of claim 1, wherein the dot structures located near the region corresponding to the central location of the diode chip have a larger area.

9. The light emitting diode structure of claim 1, wherein the distances between the adjacent dot structures in the same line are equal.

10. A light emitting diode structure, comprising:
a base;
a diode chip mounted on the base; and
a package lens covering the diode chip, wherein the surface of the package lens includes a plurality of dot structures disposed in matrix, wherein the adjacent dot structures are apart with a space, wherein the areas of the plurality of dot structures are continuously increased toward the central location of the diode chip.

11. The light emitting diode structure of claim 10, wherein the surface of the package lens is curved or flat.

12. The light emitting diode structure of claim 10, wherein the plurality of dot structures and the package lens are integrally formed into a single piece.

13. The light emitting diode structure of claim 10, wherein the plurality of dot structures are attached on the surface of the package lens.

14. The light emitting diode structure of claim 10, wherein the plurality of dot structures are selected from a group consisting of a circle, a rectangle, a regular polygon, and a polygon.

15. The light emitting diode structure of claim 10, wherein the plurality of dot structures are embossed structures.

16. The light emitting diode structure of claim 15, wherein the embossed structures are selected from a group consisting of a hemisphere, a cone, a pyramid, and a prism.

17. The light emitting diode structure of claim 10, wherein the widths of the spaces along a first direction are uniform.

18. The light emitting diode structure of claim 17, wherein the widths of the spaces along a second direction orthogonal to the first direction are uniform.

19. The light emitting diode structure of claim 10, wherein the dot structures located near the region corresponding to the central location of the diode chip have a larger area.

* * * * *